United States Patent
Brandt et al.

(10) Patent No.: US 11,650,750 B2
(45) Date of Patent: May 16, 2023

(54) PERFORMING ASYNCHRONOUS SCAN OPERATIONS ACROSS MEMORY SUBSYSTEMS

(71) Applicant: Micron Technology, Inc., Boise, ID (US)

(72) Inventors: Kevin R. Brandt, Boise, ID (US); Todd Marquart, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 308 days.

(21) Appl. No.: 16/744,117

(22) Filed: Jan. 15, 2020

(65) Prior Publication Data
US 2021/0216235 A1    Jul. 15, 2021

(51) Int. Cl.
G06F 3/00 (2006.01)
G06F 3/06 (2006.01)

(52) U.S. Cl.
CPC .......... G06F 3/0653 (2013.01); G06F 3/0619 (2013.01); G06F 3/0683 (2013.01)

(58) Field of Classification Search
None
See application file for complete search history.

(56) References Cited

U.S. PATENT DOCUMENTS

| | | | |
|---|---|---|---|
| 2017/0337012 A1* | 11/2017 | Chen | G06F 3/0611 |
| 2019/0278492 A1* | 9/2019 | Borlick | G06F 3/0619 |
| 2021/0049119 A1* | 2/2021 | Giovannini | G06F 13/1678 |
| 2022/0391104 A1* | 12/2022 | Malshe | G06F 16/2365 |

* cited by examiner

*Primary Examiner* — Midys Rojas
(74) *Attorney, Agent, or Firm* — Nicholson De Vos Webster & Elliott LLP

(57) ABSTRACT

A first delay value is obtained by a first memory subsystem of a plurality of memory subsystems. The first memory subsystem performs a first scan operation after a first time from a first event for the first memory subsystem. The first time is based on the first delay value. A second memory subsystem of the plurality of memory subsystems performs a second scan operation based upon a second delay value that is different than the first delay value.

17 Claims, 5 Drawing Sheets

PERFORMING ASYNCHRONOUS SCAN OPERATIONS ACROSS MEMORY SUBSYSTEMS

TECHNICAL FIELD

The present disclosure generally relates to systems with multiple memory subsystems, and more specifically, relates to performing asynchronous scan operations across those memory subsystems.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

SUBSYSTEM BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
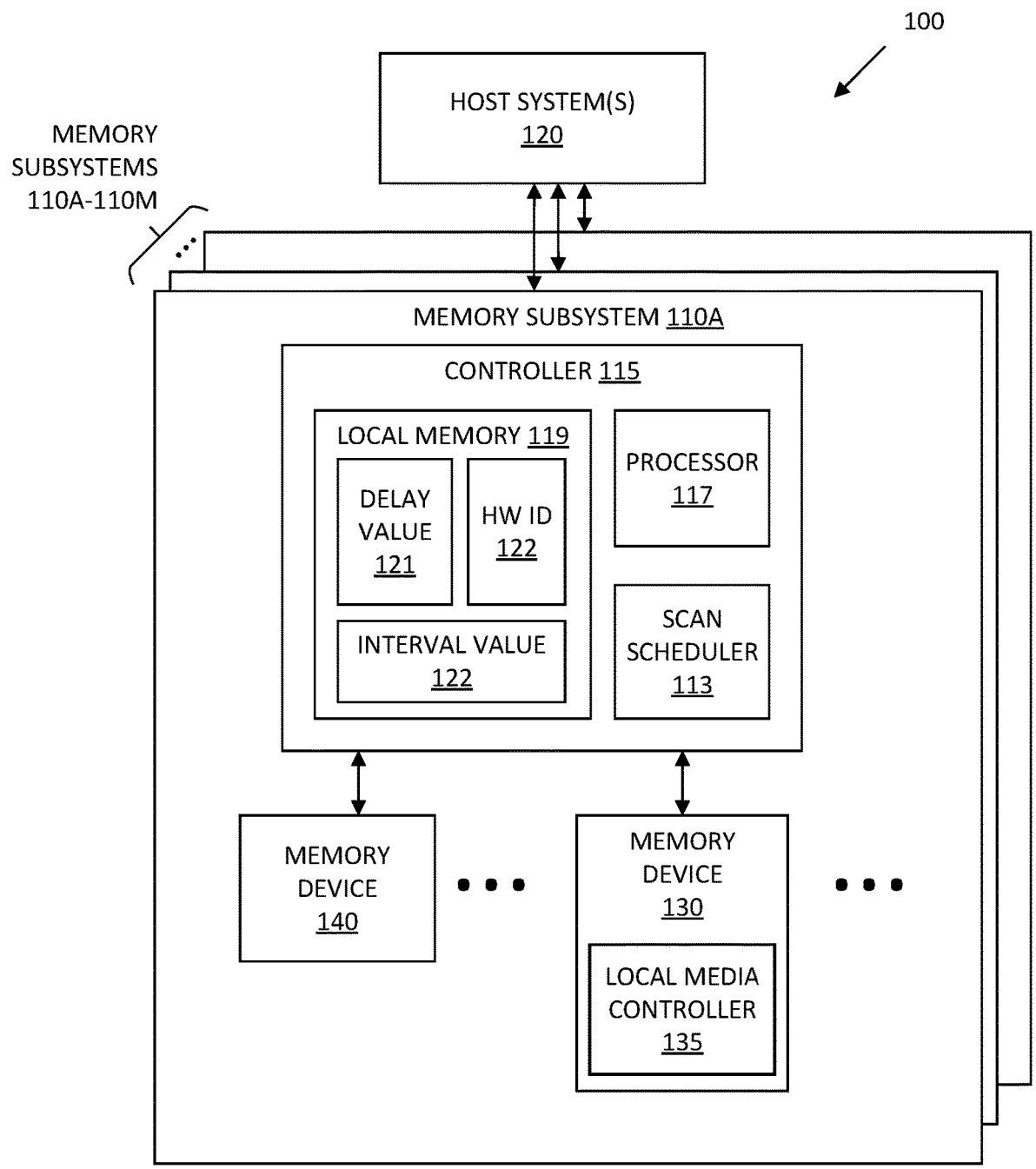
FIG. 1 illustrates an example computing environment that includes a memory subsystem in accordance with some embodiments of the present disclosure.

Aspects of the present disclosure are directed to performing asynchronous scan operations across memory subsystems. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The memory devices can include, for example, non-volatile memory devices (e.g., NAND). Other types of memory devices, including volatile memory devices, are described in greater detail below in conjunction with FIG. 1. The host system can provide data to be stored at the memory subsystem and can request data to be retrieved from the memory subsystem.

Over time and without maintenance, data stored by memory subsystems may become corrupted. Data corruption is often the result of changes to the electrical characteristics of the memory cells that represent data. For example, certain memory technologies represent bits of data (i.e., 1's and 0's) in memory cells using charge, while other memory technologies represent bits of data using resistance. Different memory technologies may be susceptible to different causes of changes to such characteristics. For example, the characteristic may decay over time, be disturbed by internal factors such as accesses to nearby memory cells, be disturbed by external factors such as temperature or radiation, etc. While error correcting codes (ECC) can be used to encode stored data and thereby allow a limited number of bit corruptions to be corrected, too many changes can result in the data becoming uncorrectable—a highly undesirable outcome.

To mitigate these risks to data integrity, memory subsystems often employ scan operations to ensure the data stored by the memory subsystem remains available. Memory subsystems can scan stored data and re-write or otherwise refresh the stored data to "reset" any changes to the data to keep the number of errors within the margin ECC or another error correction scheme can correct. For example, the memory subsystem can read "old" data (in terms of when it was written) from one of the memory devices, decode the data to correct any errors, and write the corrected data back to one of the memory devices. The duration of such scan operations is often a function of the amount of data stored by the memory subsystem (e.g., more stored data results in longer scan times). While scan operations reduce the likelihood of data loss, they are not without cost—the memory subsystem may read data from or write data to the same portion of memory that a host system attempts to access, resulting in reduced performance of the memory subsystem from the perspective of the host system. Scan operations are sometimes referred to as background scan operations or integrity scan operations and may or may not block other host-initiated operations.

Host systems can use multiple memory subsystems to improve aspects of data storage performance (e.g., higher availability due to data mirroring or replication across multiple memory subsystems, higher bandwidth due to striping of data across memory subsystems, higher reliability due to intra-subsystem parity or ECC, etc.). If each memory subsystem is configured to perform scan operations on the same cadence, a host system attempting to access the memory subsystems will experience periodic degradations in performance of the memory subsystems.

Aspects of the present disclosure address the above and other deficiencies by performing asynchronous scan operations across memory subsystems. In particular, each memory subsystem begins scan operations after a variable delay from an event such as the application of power to the memory subsystem ("power on"). For example, one memory subsystem might start scan operations one hour after power on, another might start scan operations one hour and fifteen minutes after power on, etc. As described herein, such a delay may be preprogrammed, self-generated by the memory subsystem, specified by a host system, etc. By varying the delay before scan operations are initiated, the likelihood of scan operations occurring at the same time across multiple memory subsystems in a multi-memory subsystem system is dramatically reduced, limiting any negative performance impact on host systems dependent upon the memory subsystems.

FIG. 1 illustrates an example system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110A-110M. In some embodiments, the host system 120 is coupled to different types of memory subsystems 110. FIG. 1 illustrates one example of a host system 120 coupled to multiple memory subsystems 110. The host system 120 uses the memory subsystems 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to a memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and a memory subsystem 110. The host system 120 can further utilize an NVM Express (NVMe) interface to access components (e.g., memory devices 130) when a memory subsystem 110 is coupled with the host system 120 by the PCIe interface. The physical host interface can provide an interface for passing control, address, data, and other signals between a memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point (3D cross-point) memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

Each memory subsystem 110 can further include a memory system controller 115 (or controller 115 for simplicity) to communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of a memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem).

In general, the memory subsystem controller 115 can receive commands or operations from a host system 120 (e.g., read and write commands) and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace, etc.) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

Memory subsystems 110 can also include additional circuitry or components that are not illustrated. In some embodiments, a memory subsystem 110 can include a cache or buffer (e.g., DRAM) and address circuitry (e.g., a row decoder and a column decoder) that can receive an address from the controller 115 and decode the address to access the memory devices 130.

Each memory subsystem 110 includes a scan scheduler 113 that can initiate scan operations. In some embodiments, the controller 115 includes at least a portion of the scan scheduler 113. For example, the controller 115 can include a processor 117 (processing device) configured to execute instructions stored in local memory 119 for performing the operations described herein. In some embodiments, the scan scheduler 113 is part of the host system 110, an application, or an operating system.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The scan scheduler 113 can periodically initiate scan operations. As explained above, scan operations can ensure the integrity of data stored by a memory subsystem 110 but can degrade the performance of the memory subsystem 110 from the perspective of a host system 120—particularly when each memory subsystem 110 coupled to the host system 120 performs the scan operations at the same time. The scan scheduler 113 distributes scan start times of memory subsystems 110, including in cases where those memory subsystems 110 are not in communication with each other. Further details with regards to the operations of the scan scheduler 113 are described below.

Figure 2:
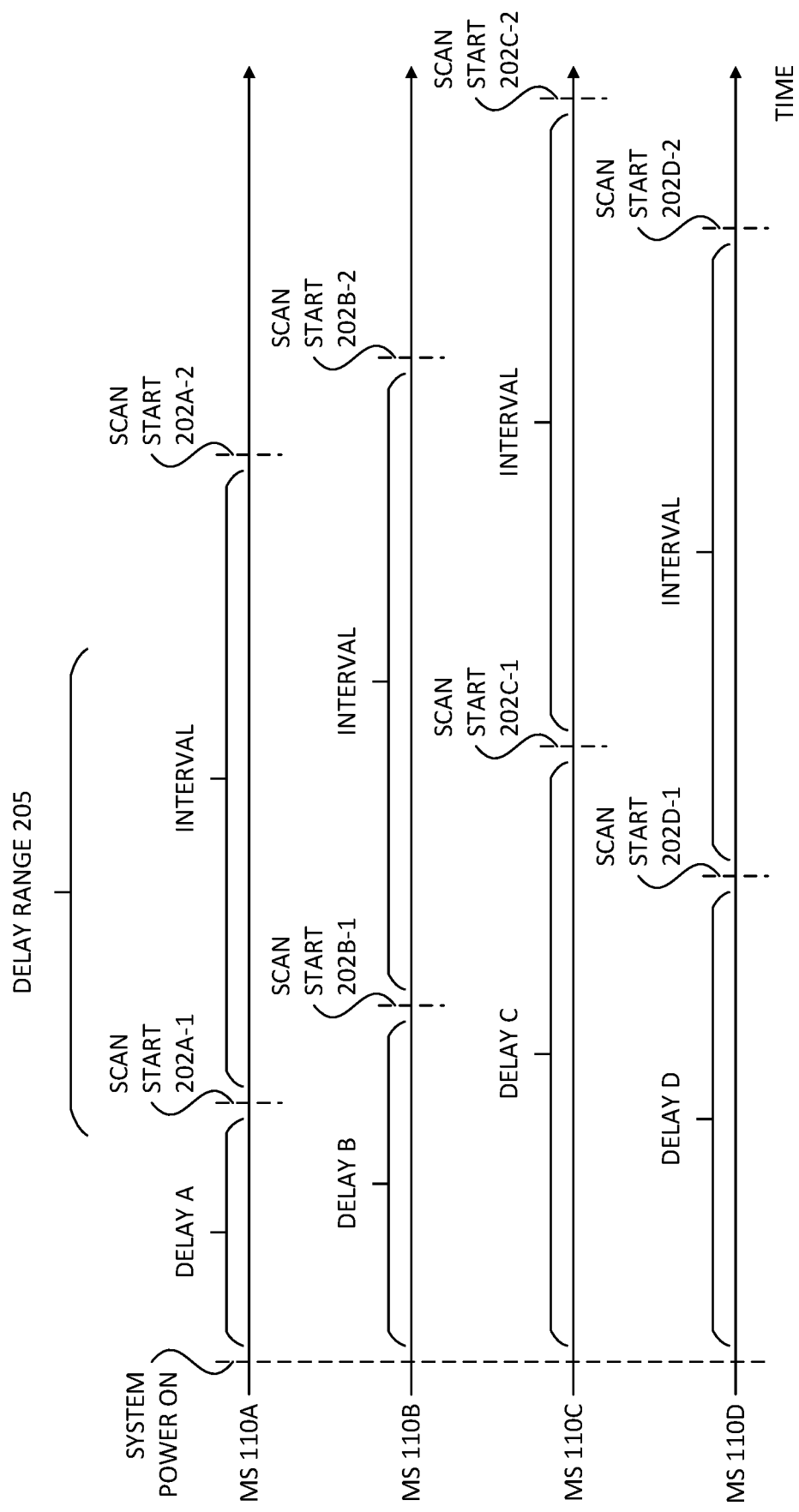
FIG. 2 illustrates an example timing of asynchronous scan operations in accordance with some embodiments of the present disclosure.

In some embodiments, the scan scheduler 113 initiates scans based on two values: a delay value 121 and an interval value 122, both of which can be stored in the local memory 119. The delay value 121 represents an amount of time following an event, such as power on, to lapse before the scan scheduler 113 initiates the first scan operation. The interval value 122 represents an amount of time to lapse before the scan scheduler 113 initiates scan operations subsequent to the first. By varying the delay values 121 across memory subsystems 110, the scan operations can be asynchronous. Further, by maintaining a fixed interval value 122 across memory subsystems 110, the chance of scan operations across memory subsystems drifting in and out of phase with each other after the variable initial delay is eliminated. As described below, FIG. 2 provides illustrates the relationship between the delay value 121 and the interval value 122.

Embodiments can use a variety of techniques to vary the delay values 121 across memory subsystems 110. Preferably, the delay values 121 from a population of memory subsystems form a uniform distribution across a range of possible delay values irrespective of the technique used such that the likelihood of multiple memory subsystems performing scan operations at the same time remains relatively constant. The lower bound of the range represents a minimum amount of time after power on a memory subsystem waits to initiate a scan. The lower bound prevents the scan operations from impacting various boot or other intensive storage operations to be performed by the host system 120 at power on. The upper bound of the range represents the maximum amount of time the memory subsystem 110 can operate after power on before initiating a scan. The upper bound can be set based on the worst-case "decay" of data to ensure that scans are performed before there is a risk of data loss. In one embodiment, the upper bound is set to a value that is less than the sum of the lower bound value and the interval value.

In some embodiments, the scan scheduler 113 can calculate or otherwise generate the delay value 121 within the range of possible delay values. For the purpose of illustrating an example, such a range may be from one hour from power on to three hours from power on. In such an example, the memory subsystem 110 can have a unique hardware identifier assigned during manufacture that is stored in a non-volatile memory (e.g., a portion of the local memory 119). Exemplary unique hardware identifiers include a manufacturer serial number and a World Wide Name. The scan scheduler 113 can read the hardware identifier to determine a delay value 121. The scan scheduler 113 can map the lowest N bits of the hardware identifier to the range of delay values. In one embodiment, the scan scheduler 113 maps an identifier to a range of delay values using a hash function. If the lowest six bits of the hardware identifier are used (e.g., 64 binary values), the two-hour window can be divided into approximately 2-minute increments (e.g., 2 hours divided by 64). In such a scenario, a hardware identifier with least significant bits of '000000' would correspond to a delay value of one hour, a hardware identifier with least significant bits of '011111' would correspond to a delay value of approximately two hours (mid-way through the range), and so on. As another example, the scan scheduler 113 can randomly generate a delay value within the range using a random number generator.

In other embodiments, the memory subsystem 110 can have the delay value 121 programmed during manufacture as a random number. In yet other embodiments, a host system 120 can program the delay value 121, giving the host system 120 more control over the relative timing of scan operations. For example, a processor of the host system 120 can execute a software driver for the memory subsystems 110. The software driver can include an API through which the host system 120 can send a delay value 121 to each connected memory subsystem 110. The software driver or the memory subsystem 110 can reject programmed delay values 110 that fall outside the range. By allowing the host system 120 to program the delay value 121, the host system 120 can achieve an even distribution of scan operations across connected memory subsystems 120.

Regardless of the technique used to vary the delay value 121 for a given memory subsystem 110, the memory subsystem 110 can store the delay value 121 in a non-volatile memory (e.g., a portion of the local memory 119) in some embodiments. Storing the delay value 121 can avoid the need to re-generate, re-calculate, re-program, or otherwise re-obtain the delay value 121 after a power cycle. In one embodiment, a valid flag can indicate the validity of the stored delay value 121. For example, the flag may be cleared initially and later set when a host system 120 programs a delay value 121 or when the scan scheduler 113 calculates and stores the delay value 121 to the non-volatile memory.

In some embodiments, a combination of techniques to vary the delay value 121 can be used. For example, a memory subsystem 110 may have a pre-programmed or calculated delay value 121 that can be superseded by the host system 110. For example, the memory subsystem 121 may store a delay value 121 calculated using a hardware identifier in a first memory location and store another delay value 121 received from the host system 120 in another memory location. In initiating scan operations, the scan scheduler 113 can first check a validity flag of the host-programmed delay value 121 to determine whether it is valid and, if so, initiate a scan based on the host-programmed delay value 121. If the host-programmed delay value 121 is invalid, the scan scheduler 113 can initiate a scan based on the delay value 121 calculated from the hardware identifier.

In some embodiments, the interval value can be varied across memory subsystems 110 from a default interval. For example, the host system 120 may program a longer or shorter duration of the interval between scan operations across each of the coupled memory subsystems 110.

FIG. 2 illustrates an example timing of asynchronous scan operations in accordance with some embodiments of the present disclosure. As illustrated, the example timing is associated with four memory subsystems (MS) 110A-110D with a power on time as indicated at the left of the diagram. A scan scheduler of the memory subsystem 110A starts a scan operation at a scan start time 202A-1 after a delay A based on a delay value of the memory subsystem 110A. A scan scheduler of the memory subsystem 110B starts a scan operation at a scan start time 202B-1 after a delay B based on a delay value of the memory subsystem 110B. A scan scheduler of the memory subsystem 110C starts a scan operation at a scan start time 202C-1 after a delay C based on a delay value of the memory subsystem 110C. A scan scheduler of the memory subsystem 110D starts a scan operation at a scan start time 202D-1 after a delay D based on a delay value of the memory subsystem 110D. Of note, the initial "-1" scan start times 202A-1, 202B-1, 202C-1, and 202D-1 fall within a delay range 205.

Based on the interval value 122, which is consistent across memory subsystems 110 in this example to prevent drift of subsequent scan start times across memory subsystems from their initial "-1" scan start times. As shown, the scan scheduler of the memory subsystem 110A starts a subsequent scan operation at a scan start time 202A-2 after an interval based on the interval value 122. The scan scheduler of the memory subsystem 110B starts a subsequent scan operation at a scan start time 202B-2 after an interval based on the interval value 122. The scan scheduler of the memory subsystem 110C starts a subsequent scan operation at a scan start time 202C-2 after an interval based on the interval value 122. The scan scheduler of the memory subsystem 110D starts a subsequent scan operation at a scan start time 202D-2 after an interval based on the interval value 122.

Figure 3:
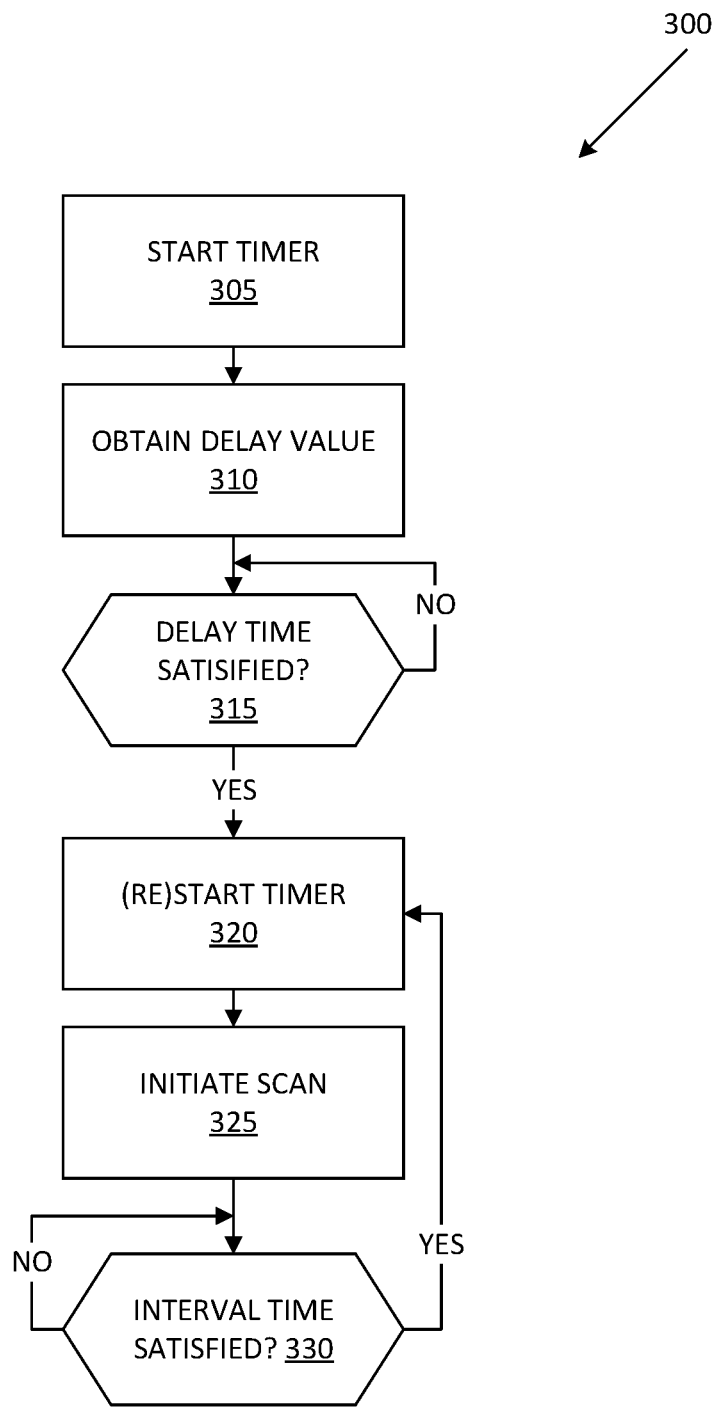
FIG. 3 is a flow diagram of an example method to perform asynchronous scan operations in accordance with some embodiments of the present disclosure.

FIG. 3 is a flow diagram of an example method to perform asynchronous scan operations in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scan scheduler 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device starts a timer at power on to track the time lapsed from an event, such as power on. Such a timer may be a hardware or software timer based on a clock signal to the processing device.

At operation 310, the processing device obtains the delay value. As described herein, various techniques can be used to set a delay value that varies across memory subsystems. For example, the processing device can receive the delay value from a host system, the processing device can calculate or otherwise generate a delay value based on a hardware identifier of the memory subsystem, the processing device can read the delay value that was programmed during manufacture from the non-volatile memory, etc.

At operation 315, the processing device determines whether a delay has been satisfied (e.g., the time associated with a delay value has lapsed). For example, if the delay value represents two hours, the processing device can check whether two hours have lapsed since power on based on the time value as tracked by the timer started at operation 305. If the time associated with the delay value has not lapsed, the method 300 returns to operation 315. If the time associated with the delay value has lapsed, the method 300 proceeds to operation 320. Although not shown, in some embodiments, the host system can update the delay value during the waiting associated with operation 315. For example, if the delay value is initially two hours, the host can supersede the two-hour delay value with another delay value sometime before the method 300 proceeds to operation 320.

At operation 320, the processing device starts a timer, and, at operation 325, the processing device initiates a scan operation to check the integrity of the data stored by the memory subsystem. Note that at operation 320, the processing device may restart the timer originally started at operation 305 or start a new timer. In another embodiment, the processing device starts or restarts the timer after the memory subsystem performs the scan operation.

At operation 330, the processing device checks whether the interval time has been satisfied (e.g., the time associated with an interval value has lapsed since the last time a scan was initiated or performed). As explained herein, after the initial delay and first scan, subsequent scans can be spaced apart based on an interval. Additional details on the relationship between the timing of scans as determined by the delay value and the interval value are shown in and described with reference to FIG. 2.

Although the description above of method 300 references the starting and possibly restarting of timers, in other embodiments the processing device can make determinations on when to initiate scan operations based on timestamps captured from a single timer or clock. For example, the processing device can record a timestamp of a clock or system timer at a power on or another event. The processing device can then periodically check whether that timestamp plus the delay value is less than or equal to the current system clock time (i.e., the delay value has lapsed). If so, the processing device can initiate the scan operation and record a new timestamp.

Figure 4:
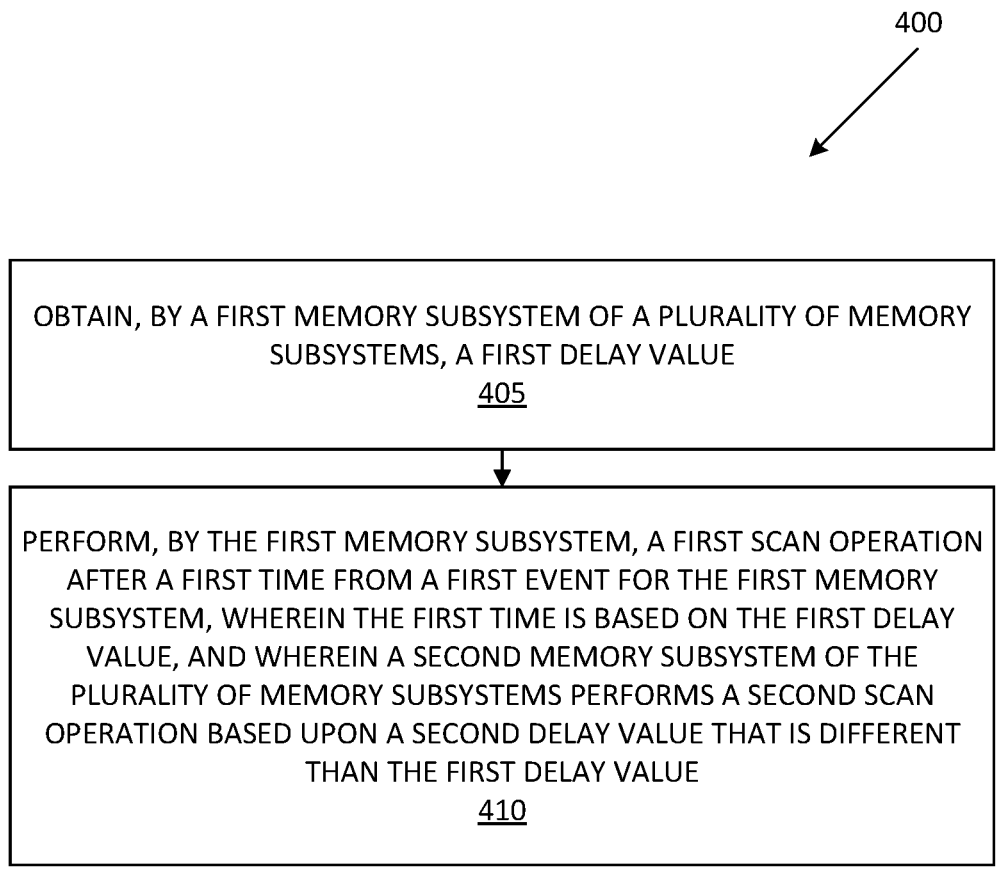
FIG. 4 is a flow diagram of another example method to perform asynchronous scan operations in accordance with some embodiments of the present disclosure.

FIG. 4 is a flow diagram of another example method to perform asynchronous scan operations in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan scheduler 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device obtains, by a first memory subsystem of a plurality of memory subsystems, a first delay value. As described above, the processing device can obtain a delay value in a variety of ways. For example, the processing device of a memory subsystem can calculate or otherwise generate the delay value from another value (e.g., a World Wide Name or other identifier) associated with the memory subsystem, such as a value stored in a non-volatile memory of the memory subsystem. As another example, the processing device can receive the delay value from a host system.

At operation 410, the processing device performs, by the first memory subsystem, a scan operation after a first time from a first event for the first memory subsystem. The first time is based on the first delay value. Additionally, a second memory subsystem of the plurality of memory subsystems performs a scan operation based upon a second delay value that is different than the first delay value. As a result, the first and second memory subsystems can perform their respective scan operations asynchronously.

As described above, a processing device can perform scans to ensure the integrity of the data stored by a memory subsystem. The processing device can perform scans at various points during the operation of the memory subsystem, such as sometime after power is applied to the memory subsystem or the memory subsystem is otherwise reset. That time is represented by the delay value. As illustrated in FIG. 2, the delays across multiple memory subsystems are preferably varied to reduce any negative performance impact that would otherwise occur if all of the memory subsystems performed scans at the same time.

Figure 5:
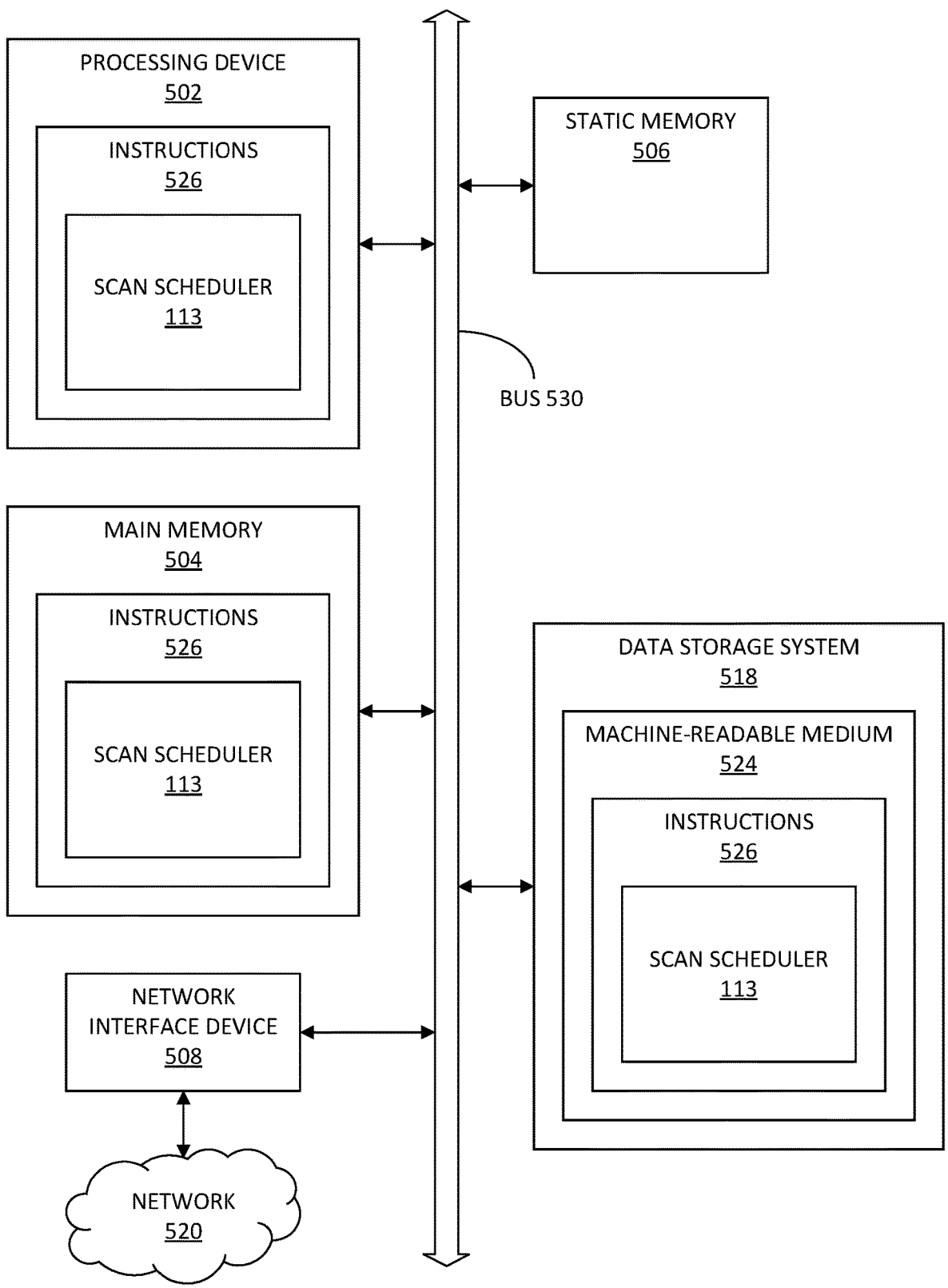
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the scan scheduler 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a scan scheduler (e.g., the scan scheduler 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
  obtaining, by a first memory subsystem of a plurality of memory subsystems, a first delay value; and
  performing, by the first memory subsystem, a first scan operation after a first time from a first event for the first memory subsystem, wherein the first time is based on the first delay value, and wherein a second memory subsystem of the plurality of memory subsystems performs a second scan operation based upon a second delay value that is different than the first delay value for the first scan operation, and wherein the first scan operation performs an integrity check of data stored by the first memory subsystem.

2. The method of claim 1, wherein obtaining the first delay value comprises calculating the first delay value based on a hardware identifier stored in a non-volatile memory of the first memory subsystem.

3. The method of claim 2, wherein the first delay value is calculated to be within a range having a lower limit that represents a minimum time after the first event before initiating the first scan operation and an upper limit that represents a maximum time after the first event to initiate the first scan operation.

4. The method of claim 1, further comprising performing, by the first memory subsystem, a third scan operation after a third time from the first time, wherein the third time is based on an interval value.

5. The method of claim 1, wherein obtaining the first delay value comprises receiving, by the first memory subsystem, the first delay value from a host system.

6. The method of claim 1, wherein the first event is a power application to the first memory subsystem.

7. A non-transitory computer-readable storage medium comprising instructions that, when executed by a processing device, cause the processing device to:
obtain, by a first memory subsystem of a plurality of memory subsystems, a first delay value; and
perform, by the first memory subsystem, a first scan operation after a first time from a first event for the first memory subsystem, wherein the first time is based on the first delay value, and wherein a second memory subsystem of the plurality of memory subsystems performs a second scan operation based upon a second delay value that is different than the first delay value for the first scan operation, and wherein the first scan operation performs an integrity check of data stored by the first memory subsystem.

8. The non-transitory computer-readable storage medium of claim 7, wherein, to obtain the first delay value, the processing device is further to calculate the first delay value based on a hardware identifier stored in the first memory subsystem.

9. The non-transitory computer-readable storage medium of claim 8, wherein the first delay value is calculated to be within a range having a lower limit that represents a minimum time after the first event before initiating the first scan operation and an upper limit that represents a maximum time after the first event to initiate the first scan operation.

10. The non-transitory computer-readable storage medium of claim 7, wherein the processing device is further to perform, by the first memory subsystem, a third scan operation after a third time from the first time, wherein the third time is based on an interval value.

11. The non-transitory computer-readable storage medium of claim 7, wherein, to obtain the first delay value, the processing device is further to receive, by the first memory subsystem, the first delay value from a host system.

12. The non-transitory computer-readable storage medium of claim 7, wherein the first event is a power application to the first memory subsystem.

13. A system comprising:

a memory component; and a processing device, operatively coupled with the memory component, to:

obtain a first delay value, wherein the memory component and the processing device are part of a first memory subsystem of a plurality of memory subsystems; and perform a first scan operation after a first time from a power application to the first memory subsystem, wherein the first time is based on the first delay value, and wherein a second memory subsystem of the plurality of memory subsystems performs a second scan operation based upon a second delay value that is different than the first delay value for the first scan operation, and wherein the first scan operation performs an integrity check of data stored by the first memory subsystem.

14. The system of claim 13, wherein, to obtain the first delay value, the processing device is further to calculate the first delay value based on a hardware identifier stored in a non-volatile memory of the first memory subsystem.

15. The system of claim 14, wherein the first delay value is calculated to be within a range having a lower limit that represents a minimum time after the power application to the first memory subsystem before initiating the first scan operation and an upper limit that represents a maximum time after the power application to the first memory subsystem to initiate the first scan operation.

16. The system of claim 13, wherein the processing device is further to perform a third scan operation after a third time from the first time, wherein the third time is based on an interval value.

17. The system of claim 13, wherein, to obtain the first delay value, the processing device is further to receive the first delay value from a host system.

* * * * *